(12) United States Patent
Price et al.

(10) Patent No.: US 9,494,957 B2
(45) Date of Patent: Nov. 15, 2016

(54) DISTRIBUTED VOLTAGE NETWORK CIRCUITS EMPLOYING VOLTAGE AVERAGING, AND RELATED SYSTEMS AND METHODS

(71) Applicant: QUALCOMM Incorporated, San Diego, CA (US)

(72) Inventors: Burt Lee Price, Apex, NC (US); Yeshwant Nagaraj Kolla, Wake Forest, NC (US); Dhaval Rajeshbhai Shah, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 113 days.

(21) Appl. No.: 14/482,456

(22) Filed: Sep. 10, 2014

(65) Prior Publication Data
US 2016/0070277 A1    Mar. 10, 2016

(51) Int. Cl.
*G01R 1/30* (2006.01)
*G05F 1/46* (2006.01)
*H01L 21/66* (2006.01)
*G01R 19/00* (2006.01)
*G01R 31/30* (2006.01)

(52) U.S. Cl.
CPC .............. *G05F 1/46* (2013.01); *H01L 22/30* (2013.01); *G01R 19/003* (2013.01); *G01R 31/3004* (2013.01)

(58) Field of Classification Search
CPC . G05F 1/46; G01R 31/3004; G01R 31/3606; G01R 31/26; G01R 31/2621; G01R 19/003; G01R 19/2642; G01R 19/10; G01R 19/16542; G01R 19/0092
See application file for complete search history.

(56) References Cited

U.S. PATENT DOCUMENTS

| | | | |
|---|---|---|---|
| 3,934,209 A * | 1/1976 | Valentine | H03F 3/42 330/295 |
| 5,436,581 A | 7/1995 | Oberhauser | |
| 6,191,966 B1 | 2/2001 | Yu | |
| 6,937,178 B1 | 8/2005 | Rempfer et al. | |
| 7,718,448 B1 | 5/2010 | Brisbin et al. | |
| 8,582,266 B2 | 11/2013 | Bertin et al. | |

(Continued)

OTHER PUBLICATIONS

Lionel, Vincent et al., "Embedding Statistical Tests for On-Chip Dynamic Voltage and Temperature Monitoring," 2012 49th ACM/EDAC/IEEE Design Automation Conference (DAC), Jun. 3-7, 2012, IEEE, pp. 994-999.

(Continued)

*Primary Examiner* — Son Le
*Assistant Examiner* — Thang Le
(74) *Attorney, Agent, or Firm* — Withrow & Terranova, PLLC

(57) ABSTRACT

Distributed voltage network circuits employing voltage averaging, and related systems and methods are disclosed. In one aspect, because voltage in one area of a distributed load circuit may vary from voltage in a second area, a distributed voltage network circuit is configured to tap voltages from multiple areas to calculate average voltage in the distributed load circuit. The distributed voltage network circuit includes a voltage distribution source component having source nodes. Voltage is distributed from each source node to a corresponding voltage load node via resistive interconnects. Voltage tap nodes access voltage from each corresponding voltage load node. Each voltage tap node is coupled to an input node of a corresponding resistive element in voltage averaging circuit. An output node of each resistive element is coupled to a voltage output node of the voltage averaging circuit, generating the average voltage of the distributed load circuit on the voltage output node.

25 Claims, 11 Drawing Sheets

(56) References Cited

U.S. PATENT DOCUMENTS

| | | | |
|---|---|---|---|
| 2009/0128120 A1* | 5/2009 | Tatsuda | H01L 27/0629 323/351 |
| 2013/0063113 A1 | 3/2013 | Couleur et al. | |
| 2014/0079970 A1 | 3/2014 | Despesse et al. | |
| 2015/0370280 A1* | 12/2015 | Ryabchenkov | G05F 3/26 323/315 |

OTHER PUBLICATIONS

International Search Report and Written Opinion for PCT/US2015/046067, mailed Nov. 13, 2015, 13 pages.

Second Written Opinion for PCT/US2015/046067, mailed Sep. 8, 2016, 6 pages.

* cited by examiner

DISTRIBUTED VOLTAGE NETWORK CIRCUITS EMPLOYING VOLTAGE AVERAGING, AND RELATED SYSTEMS AND METHODS

BACKGROUND

I. Field of the Disclosure

The technology of the disclosure relates generally to distributed voltage network circuits, and specifically to measuring voltage and current within such circuits.

II. Background

Thermal emissions are a problem of increasing concern in integrated circuit (IC) design. High temperatures in an IC may cause carrier mobility degradation, which may slow down operation of the IC, increase resistivity, and/or cause circuit failures. This problem has become especially critical as voltage scaling has slowed down and the number of active components per unit area has increased. In this regard, the temperature of an IC fabricated on a semiconductor die, such as a microprocessor or cache memory, may be determined or estimated based on current measurement within the IC. As a non-limiting example, current measurement within an IC may be used to determine whether the current within the IC exceeds a defined current threshold. If the measured current within the IC exceeds the defined current threshold, a control system corresponding to the IC may be configured to perform certain functions that improve IC performance, such as preventing the IC from overheating.

Although on-die current measurement of an IC on a semiconductor die may be used to estimate temperature of the IC, accurately measuring current within the IC may be difficult. In particular, because voltage distribution, and hence current distribution, may differ across distributed circuit elements within an IC, the current profile of a particular area of an IC is not necessarily indicative of the current profile of other areas of the IC or the entire IC. For example, a first current distributed to a first area of an IC may be different from a second current distributed to a second area of the IC. Thus, measuring current in one particular area of an IC may not provide an accurate representation of overall current within the IC. Inaccurate current measurements within the IC results in inaccurate temperature estimations within the IC, which may then reduce the effectiveness of temperature-based functions configured to improve performance of an IC.

In this regard, it would be advantageous to more accurately measure on-die current in light of varying voltage and current profiles across distributed elements within an IC. In particular, providing more accurate on-die current measurements may improve results generated by functions within a corresponding control system that use the current measurement to increase system performance.

SUMMARY OF THE DISCLOSURE

Aspects disclosed in the detailed description include distributed voltage network circuits employing voltage averaging. Related systems and methods are also disclosed. In one aspect, because a voltage distributed to one area of a distributed load circuit within an integrated circuit (IC) may vary from a voltage distributed to a second area of the same distributed load circuit, a distributed voltage network circuit is configured to tap voltages from multiple areas to calculate an average voltage distributed in the distributed load circuit. The distributed voltage network circuit includes a voltage distribution source component having multiple source nodes. Voltage is distributed from each source node to a corresponding voltage load node of the distributed load circuit via resistive interconnects within a distribution network. Voltage tap nodes are employed within the distribution network to access the voltage from each corresponding voltage load node. To calculate the average voltage in the distributed load circuit, each voltage tap node is coupled to an input node of a corresponding resistive element in a voltage averaging circuit. Further, an output node of each resistive element is coupled to one voltage output node of the voltage averaging circuit. Coupling the output nodes of each resistive element while the input node of each resistive element is coupled to a corresponding voltage tap node generates the average voltage of the distributed load circuit on the voltage output node.

Because the voltage at a particular voltage load node may vary as compared to the voltage at another voltage load node, the determined average voltage provides a more accurate measurement of voltage across the entire distributed load circuit. Thus, the average voltage may be used to more accurately calculate the current in the distributed load circuit, as compared to calculating current using a voltage in a specific area or single voltage load node of the IC. A more accurate current measurement may improve functions within a corresponding control system that use the current measurement to increase system performance.

In this regard in one aspect, a distributed voltage network circuit is disclosed. The distributed voltage network circuit comprises a voltage distribution source component. The voltage distribution source component comprises a plurality of source nodes. The distributed voltage network circuit further comprises a distributed load circuit comprising a plurality of voltage load nodes. The distributed voltage network circuit further comprises a distributed source distribution network. The distributed source distribution network comprises a plurality of resistive interconnects interconnecting each source node among the plurality of source nodes to a corresponding voltage load node among the plurality of voltage load nodes. The distributed source distribution network further comprises a plurality of voltage tap nodes, wherein each voltage tap node corresponds to a voltage load node among the plurality of voltage load nodes. The distributed voltage network circuit further comprises a voltage averaging circuit. The voltage averaging circuit comprises a plurality of resistive elements. Each resistive element among the plurality of resistive elements comprises an input node coupled to a corresponding voltage tap node among the plurality of voltage tap nodes and an output node. The voltage averaging circuit further comprises a voltage output node coupled to the output node of each resistive element among the plurality of resistive elements. The voltage output node is configured to provide an average voltage in the distributed load circuit.

In another aspect, a distributed voltage network circuit is disclosed. The distributed voltage network circuit comprises a means for distributing a source voltage to a plurality of voltage load nodes via a distributed source distribution network, wherein the distributed source distribution network comprises a plurality of resistive interconnects interconnecting each source node of a plurality of source nodes to a corresponding voltage load node among the plurality of voltage load nodes. The distributed voltage network circuit further comprises a means for receiving the source voltage at the plurality of voltage load nodes. The distributed voltage network circuit further comprises a means for determining a voltage present at each voltage load node among the plurality of voltage load nodes via a corresponding voltage tap node of a plurality of voltage tap nodes. The distributed voltage network circuit further comprises a means for providing the voltage present at each voltage tap node among the plurality of voltage tap nodes to a corresponding resistive element among a plurality of resistive elements. The distributed voltage network circuit further comprises a means for providing an output voltage of each resistive element among the plurality of resistive elements to a voltage output node configured to provide an average voltage across the plurality of voltage load nodes.

In another aspect, a method of calculating an average voltage of a distributed voltage network circuit is disclosed. The method comprises distributing a source voltage to a plurality of voltage load nodes via a distributed source distribution network, wherein the resistive interconnection network comprises a plurality of resistive interconnects interconnecting each source node of a plurality of source nodes to a corresponding voltage load node among the plurality of voltage load nodes. The method further comprises receiving the source voltage at the plurality of voltage load nodes. The method further comprises determining a voltage present at each voltage load node among the plurality of voltage load nodes via a corresponding voltage tap node of a plurality of voltage tap nodes. The method further comprises providing the voltage present at each voltage tap node among the plurality of voltage tap nodes to a corresponding resistive element among a plurality of resistive elements. The method further comprises providing an output voltage of each resistive element among the plurality of resistive elements to a voltage output node configured to provide an average voltage across the plurality of voltage load nodes.

In another aspect, an on-die current measurement system is disclosed. The on-die current measurement system comprises a voltage source. The on-die current measurement system further comprises a distributed load circuit comprising a plurality of voltage load nodes. The on-die current measurement system further comprises a plurality of cascode transistors. The on-die current measurement system further comprises a plurality of headswitch transistors, wherein each headswitch transistor among the plurality of headswitch transistors is coupled to the voltage source. The on-die current measurement system further comprises a plurality of mirror transistors, wherein each mirror transistor among the plurality of mirror transistors is coupled to the voltage source. The on-die current measurement system further comprises a distributed source distribution network. The distributed source distribution network comprises a plurality of headswitch resistive interconnects interconnecting each headswitch transistor among the plurality of headswitch transistors to a corresponding voltage load node among the plurality of voltage load nodes. The distributed source distribution network further comprises a plurality of mirror resistive interconnects interconnecting each mirror transistor among the plurality of mirror transistors to a source of a corresponding cascode transistor among the plurality of cascode transistors. The distributed source distribution network further comprises a plurality of headswitch voltage tap nodes, wherein each headswitch voltage tap node corresponds to a voltage load node among the plurality of voltage load nodes. The distributed source distribution network further comprises a plurality of mirror voltage tap nodes, wherein each mirror voltage tap node corresponds to a cascode transistor among the plurality of cascode transistors.

The on-die current measurement system further comprises a headswitch voltage averaging circuit comprising a plurality of resistors. Each resistor among the plurality of resistors comprises an input node coupled to a corresponding headswitch voltage tap node among the plurality of headswitch voltage tap nodes, and an output node. The headswitch voltage averaging circuit further comprises a headswitch voltage output node coupled to the output node of each resistor, the voltage output node configured to provide an average headswitch voltage present in the distributed load circuit. The on-die current measurement system further comprises a mirror voltage averaging circuit comprising a plurality of resistors. Each resistor among the plurality of resistors comprises an input node coupled to a corresponding mirror transistor among the plurality of mirror transistors, and an output node. The mirror voltage averaging circuit further comprises a mirror voltage output node coupled to the output node of each resistor, the voltage output node configured to provide an average mirror voltage present in the plurality of cascode transistors. The on-die current measurement system further comprises a drain of each cascode transistor among the plurality of cascode transistors coupled to a sense resistor, the sense resistor configured to provide a voltage to an analog-to-digital converter (ADC). The on-die current measurement system further comprises the ADC configured to convert the voltage from the sense resistor into a digital signal representative of a power supply current of the distributed load circuit. The on-die current measurement system further comprises an operational amplifier. The operational amplifier comprises a first input coupled to the headswitch voltage output node. The operational amplifier further comprises a second input coupled to the mirror voltage output node. The operational amplifier further comprises an output node coupled to a gate corresponding to the plurality of cascode transistors.

DETAILED DESCRIPTION

Figure 1:
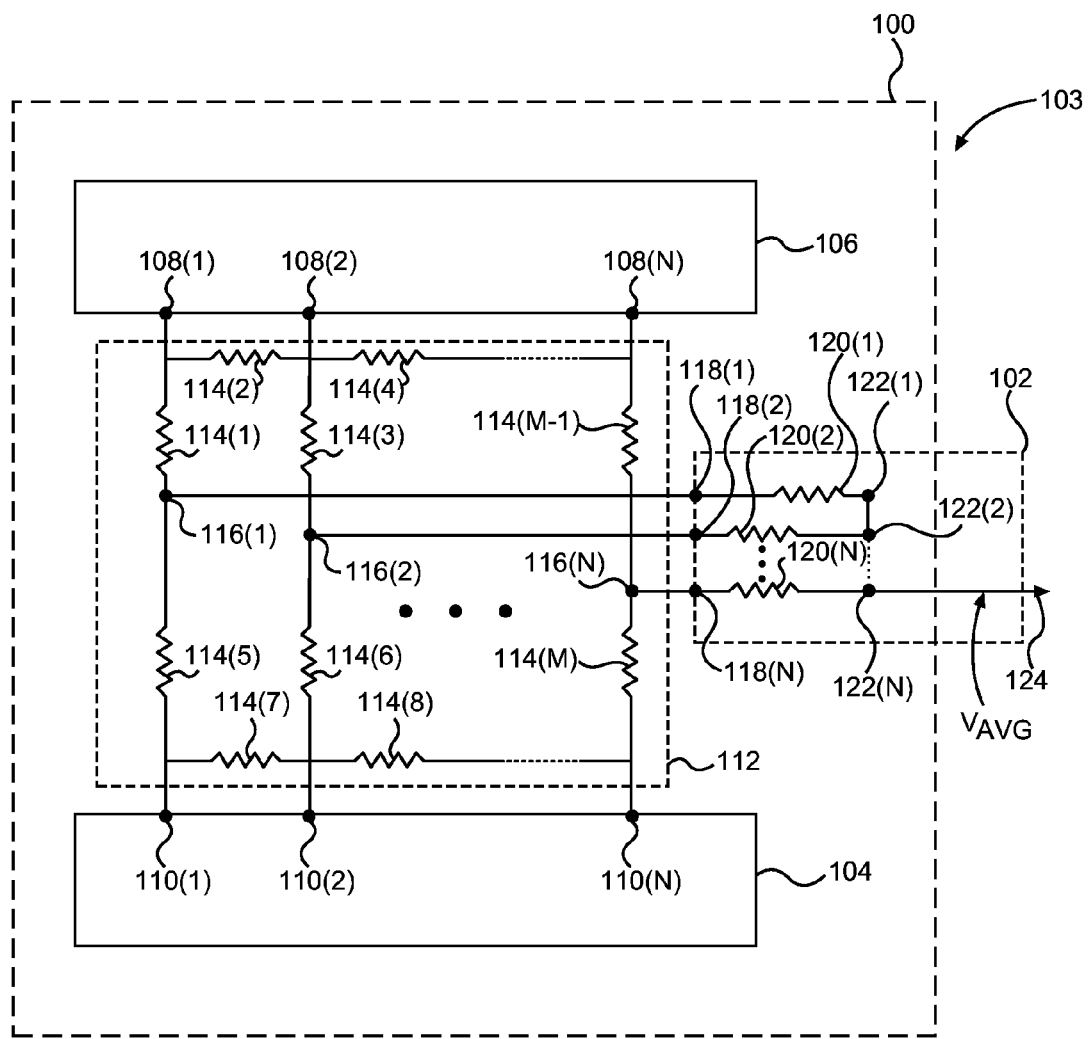
FIG. 1 is a block diagram of an exemplary distributed voltage network circuit within an integrated circuit (IC) employing a voltage averaging circuit configured to calculate an average voltage of a distributed load circuit by averaging voltages in multiple areas of the distributed load circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include distributed voltage network circuits employing voltage averaging. Related systems and methods are also disclosed. In one aspect, because a voltage distributed to one area of a distributed load circuit within an integrated circuit (IC) may vary from a voltage distributed to a second area of the same distributed load circuit, a distributed voltage network circuit is configured to tap voltages from multiple areas to calculate an average voltage distributed in the distributed load circuit. The distributed voltage network circuit includes a voltage distribution source component having multiple source nodes. Voltage is distributed from each source node to a corresponding voltage load node of the distributed load circuit via resistive interconnects within a distribution network. Voltage tap nodes are employed within the distribution network to access the voltage from each corresponding voltage load node. To calculate the average voltage in the distributed load circuit, each voltage tap node is coupled to an input node of a corresponding resistive element in a voltage averaging circuit. Further, an output node of each resistive element is coupled to one voltage output node of the voltage averaging circuit. Coupling the output nodes of each resistive element while the input node of each resistive element is coupled to a corresponding voltage tap node generates the average voltage of the distributed load circuit on the voltage output node.

Because the voltage at a particular voltage load node may vary as compared to the voltage at another voltage load node, the determined average voltage provides a more accurate measurement of voltage across the entire distributed load circuit. Thus, the average voltage may be used to more accurately calculate the current in the distributed load circuit, as compared to calculating current using a voltage in a specific area or single voltage load node of the IC. A more accurate current measurement may improve functions within a corresponding control system that use the current measurement to increase system performance.

In this regard, FIG. 1 is a block diagram of an exemplary distributed voltage network circuit 100 employing a voltage averaging circuit 102. The distributed voltage network circuit 100 is provided in an integrated circuit (IC) 103 in a semiconductor die in this example. The voltage averaging circuit 102 is configured to calculate an average voltage ($V_{AVG}$) of a distributed load circuit 104 by averaging voltages provided to multiple areas of the distributed load circuit 104. More specifically, the distributed voltage network circuit 100 is configured to tap voltages from multiple areas to calculate the average voltage ($V_{AVG}$) distributed to the distributed load circuit 104. Thus, as an example, the average voltage ($V_{AVG}$) may be used to more accurately calculate the current in the distributed load circuit 104, as compared to calculating the current using a voltage present in a single voltage load node of the distributed load circuit 104. The calculated current may be used to estimate the temperature within the IC 103.

With continuing reference to FIG. 1, the distributed voltage network circuit 100 includes a voltage distribution source component 106 that employs a plurality of source nodes 108(1)-108(N). Voltage is distributed from each source node 108(1)-108(N) to a corresponding voltage load node 110(1)-110(N) of the distributed load circuit 104 via a distributed source distribution network 112. The distributed source distribution network 112 includes a plurality of resistive interconnects 114(1)-114(M) that connect each source node 108(1)-108(N) to the corresponding voltage load node 110(1)-110(N). Notably, while this aspect employs a separate resistor for each resistive interconnect 114(1)-114(M), other aspects may use alternative circuit elements for each resistive interconnect 114(1)-114(M), such as, for a non-limiting example, a length of wire having a certain resistive value. Further, voltage tap nodes 116(1)-116(N) are employed within the distributed source distribution network 112 to access the voltage from each corresponding voltage load node 110(1)-110(N).

With continuing reference to FIG. 1, to calculate the average voltage in the distributed load circuit 104, each voltage tap node 116(1)-116(N) is coupled to an input node 118(1)-118(N) of a corresponding resistive element 120(1)-120(N) in the voltage averaging circuit 102. Notably, although each resistive element 120(1)-120(N) in this aspect is a single resistor, other aspects may employ other circuit elements for each resistive element 120(1)-120(N) to achieve similar functionality. An output node 122(1)-122(N) of each resistive element 120(1)-120(N) is coupled to a voltage output node 124 of the voltage averaging circuit 102. Coupling each output node 122(1)-122(N) while each input node 118(1)-118(N) is coupled to a corresponding voltage tap node 116(1)-116(N) generates the average voltage ($V_{AVG}$) of the distributed load circuit 104 on the voltage output node 124. More specifically, the average voltage ($V_{AVG}$) may be calculated using a resistance (R) of each resistive element 120(1)-120(N) and a voltage (V) of each voltage tap node 116(1)-116(N) by way of the following equation:

$$V_{AVG} = (R(120(1)) \| R(120(2)) \| \ldots R(120(N))) * (V(116(1))/R(120(1)) + V(116(2))/R(120(2)) + \ldots V(116(N))/R(120(N)))$$

In this manner, since the voltage at each voltage load node 110(1)-110(N) may vary as compared to any other voltage load node 110(1)-110(N), the average voltage ($V_{AVG}$) provides a more accurate measurement of voltage provided to the entire distributed load circuit 104. Thus, the average voltage ($V_{AVG}$) may be used to more accurately calculate the current in the distributed load circuit 104, as compared to calculating the current using a voltage at only one of the voltage load nodes 110(1)-110(N). A more accurate current measurement may improve functions within a corresponding control system that use the current measurement to increase system performance.

Figure 2:
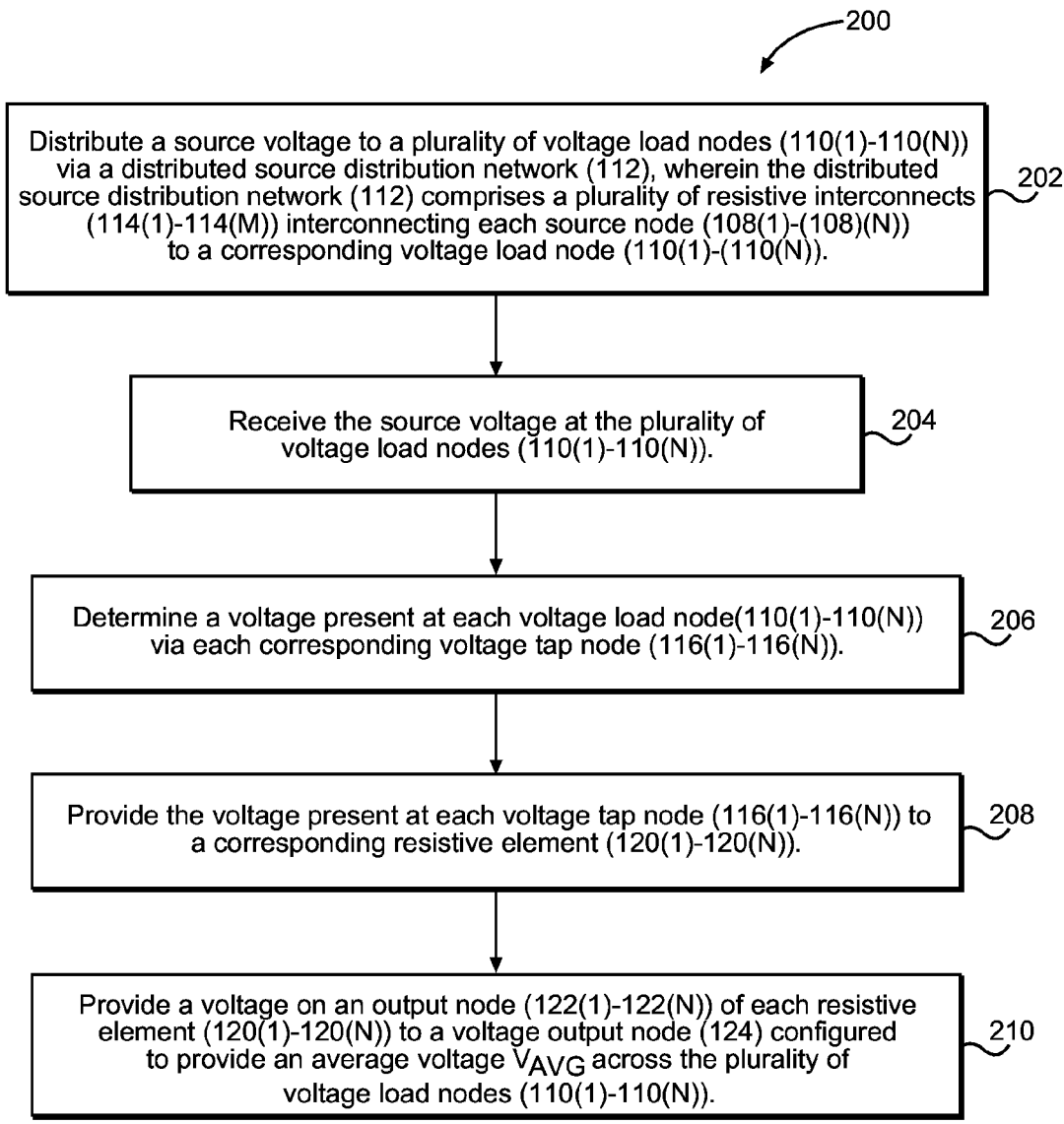
FIG. 2 is a flowchart of an exemplary process employed by the distributed voltage network circuit in FIG. 1 to calculate an average voltage of the distributed load circuit.

In this regard, FIG. 2 illustrates an exemplary process 200 employed by the distributed voltage network circuit 100 in FIG. 1 to calculate the average voltage ($V_{AVG}$) of the distributed load circuit 104 by averaging voltages provided to multiple areas of the distributed load circuit 104. With reference to FIG. 2, the voltage distribution source component 106 distributes a source voltage to the plurality of voltage load nodes 110(1)-110(N) via the distributed source distribution network 112 (block 202). In particular, the distributed source distribution network 112 includes the plurality of resistive interconnects 114(1)-114(M) interconnecting each source node 108(1)-108(N) to a corresponding voltage load node 110(1)-110(N). Because of such interconnections, each voltage load node 110(1)-110(N) receives the source voltage (block 204). The distributed voltage network circuit 100 determines a voltage present at each voltage load node 110(1)-110(N) via each corresponding voltage tap node 116(1)-116(N) employed within the distributed source distribution network 112 (block 206). The voltage at each voltage tap node 116(1)-116(N) is provided to the input node 118(1)-118(N) of each corresponding resistive element 120(1)-120(N) in the voltage averaging circuit 102 (block 208). The voltage averaging circuit 102 provides the voltage on the output node 122(1)-122(N) of each resistive element 120(1)-120(N) to the voltage output node 124, which is configured to provide the average voltage ($V_{AVG}$) across the voltage load nodes 110(1)-110(N) of the distributed load circuit 104 (block 210). Employing the process 200 allows the distributed voltage network circuit 100 to calculate the average voltage ($V_{AVG}$), which may be used to more accurately calculate the current in the distributed load circuit 104, as compared to calculating the current using a voltage present in only one of the voltage load nodes 110(1)-110(N).

Figure 3:
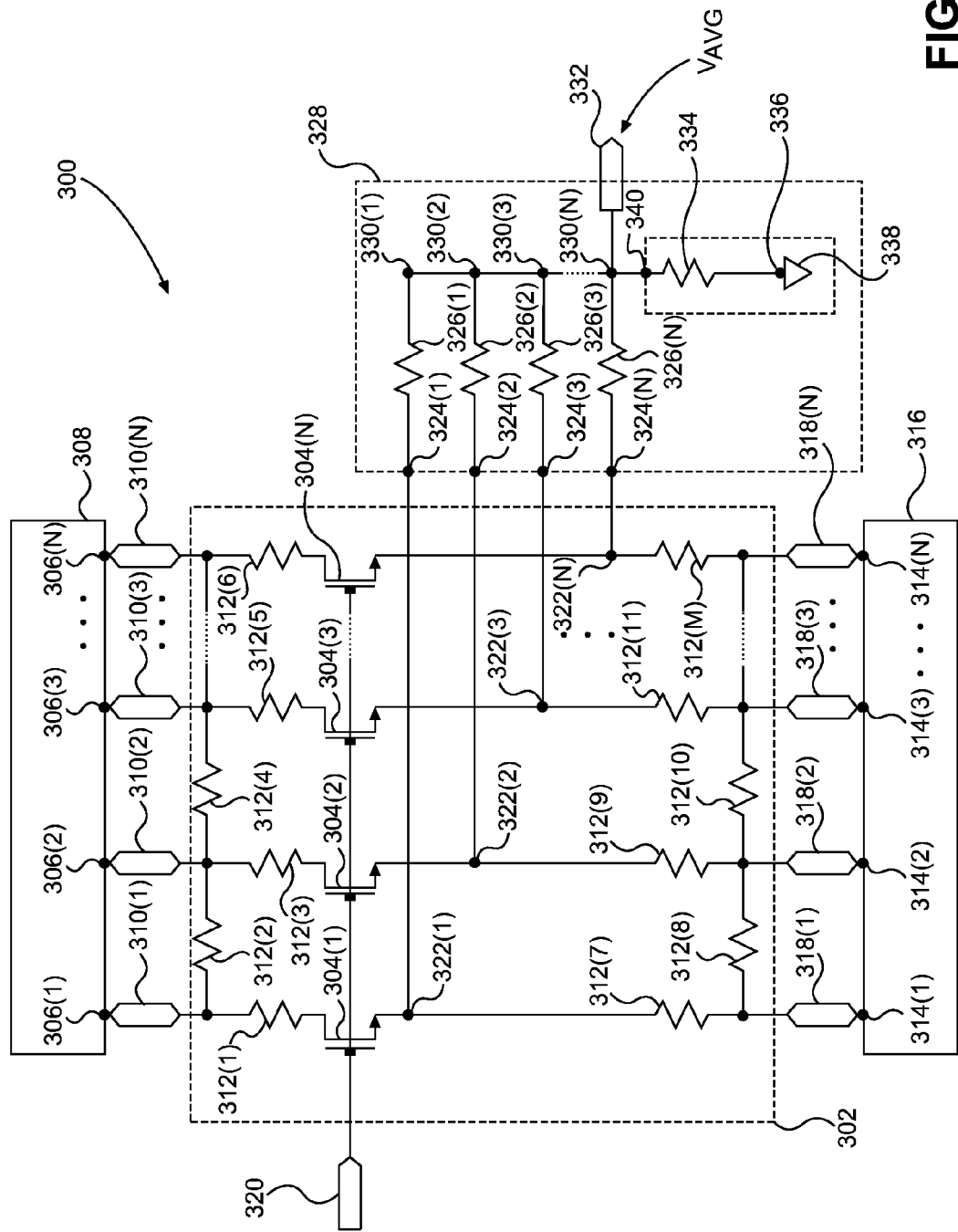
FIG. 3 is a circuit diagram of another exemplary distributed voltage network circuit similar to the distributed voltage network circuit in FIG. 1 but employing n-type metal-oxide semiconductor (NMOS) transistors in a distributed source distribution network.

Various types of distributed circuits similar to the distributed voltage network circuit 100 in FIG. 1 may use the average voltage ($V_{AVG}$) as a valuable metric. As a non-limiting example, a distributed voltage network circuit similar to the distributed voltage network circuit 100 may employ distributed transistors, wherein a distributed source distribution network similar to the distributed source distribution network 112 includes multiple transistors. In this regard, FIG. 3 illustrates an n-type metal-oxide semiconductor (NMOS) distributed voltage network circuit 300, wherein a distributed source distribution network 302 employs NMOS transistors 304(1)-304(N). Notably, while the NMOS transistors 304(1)-304(N) are in the distributed source distribution network 302 in this aspect, the NMOS transistors 304(1)-304(N) may be located in other elements in other aspects. Each NMOS transistor 304(1)-304(N) is coupled to a corresponding source node 306(1)-306(N) of a voltage distribution source component 308 via a corresponding drain 310(1)-310(N). The distributed source distribution network 302 includes a plurality of resistive interconnects 312(1)-312(M) that, in conjunction with the NMOS transistors 304(1)-304(N), connect each source node 306(1)-306(N) to a corresponding voltage load node 314(1)-314(N) of a distributed load circuit 316. Particularly, a source 318(1)-318(N) of each corresponding NMOS transistor 304(1)-304(N) couples to the corresponding voltage load node 314(1)-314(N). Further, voltage provided to a gate 320 of the NMOS distributed voltage network circuit 300 controls each NMOS transistor 304(1)-304(N). Voltage tap nodes 322(1)-322(N) are employed within the distributed source distribution network 302 to access the voltage from each corresponding source 318(1)-318(N), and by extension, each voltage load node 314(1)-314(N).

With continuing reference to FIG. 3, to calculate the average voltage ($V_{AVG}$) in the distributed load circuit 316, each voltage tap node 322(1)-322(N) is coupled to an input node 324(1)-324(N) of a corresponding resistor 326(1)-326(N) in a voltage averaging circuit 328. An output node 330(1)-330(N) of each resistor 326(1)-326(N) is coupled to a voltage output node 332 of the voltage averaging circuit 328. Coupling each output node 330(1)-330(N) while each input node 324(1)-324(N) is coupled to a corresponding voltage tap node 322(1)-322(N) generates the average voltage ($V_{AVG}$) of the distributed load circuit 316 on a voltage output node 332. As previously described, the following equation describes the average voltage ($V_{AVG}$) in terms of the resistance R of each resistor 326(1)-326(N) and voltage V at each voltage tap node 322(1)-322(N):

$$V_{AVG} = (R(326(1)) \| R(326(2)) \| \ldots R(326(N))) * (V(322(1))/R(326(1)) + V(322(2))/R(326(2)) + \ldots V(322(N))/R(326(N)))$$

In this manner, the above equation describes the average voltage ($V_{AVG}$) on the voltage output node 332 when the gate width of one or more NMOS transistors 304(1)-304(N) is not approximately equal to the gate width of every other NMOS transistor 304(N)-304(N), as well as when each NMOS transistor 304(1)-304(N) has an approximately equal gate width. Notably, if the gate width of one or more NMOS transistors 304(1)-304(N) is not approximately equal to the gate width of every other NMOS transistor 304(1)-304(N), each resistor 326(1)-326(N) may not have an approximately equal resistance R. Rather, each resistor 326(1)-326(N) must have an appropriate resistance R in relation to the gate width of the corresponding NMOS transistor 304(1)-304(N) so that the equation described above accurately calculates the average voltage ($V_{AVG}$). Further, if each NMOS transistor 304(1)-304(N) has an approximately equal gate width, each resistor 326(1)-326(N) must have an approximately equal resistance R to accurately calculate the average voltage ($V_{AVG}$). In particular, if each NMOS transistor 304(1)-304(N) has an approximately equal gate width, and thus each resistor 326(1)-326(N) has an approximately equal resistance R, the equation described above simplifies to the following equation:

$$V_{AVG} = (1/N) * (V(322(1)) + V(322(2)) + \ldots V(322(N)))$$

With continued reference to FIG. 3, in addition to the resistors 326(1)-326(N), the voltage averaging circuit 328 may also employ a scaling resistor 334. The scaling resistor 334 has an input node 336 coupled to a ground source 338, and an output node 340 coupled to the output node 330(1)-330(N) of each resistor 326(1)-326(N). In this manner, the scaling resistor 334 may be used to scale the average voltage ($V_{AVG}$) by a scaling factor corresponding to the resistance of the scaling resistor 334 as compared to the average voltage ($V_{AVG}$) generated when the scaling resistor 334 is not employed. Whether or not the scaling resistor 334 is employed in the voltage averaging circuit 328, the average voltage ($V_{AVG}$) may be used to more accurately calculate the current in the distributed load circuit 316, as compared to calculating the current using a voltage at only one of the voltage load nodes 314(1)-314(N). A more accurate current measurement may improve functions within a corresponding control system that use the current measurement to increase system performance.

Figure 4:
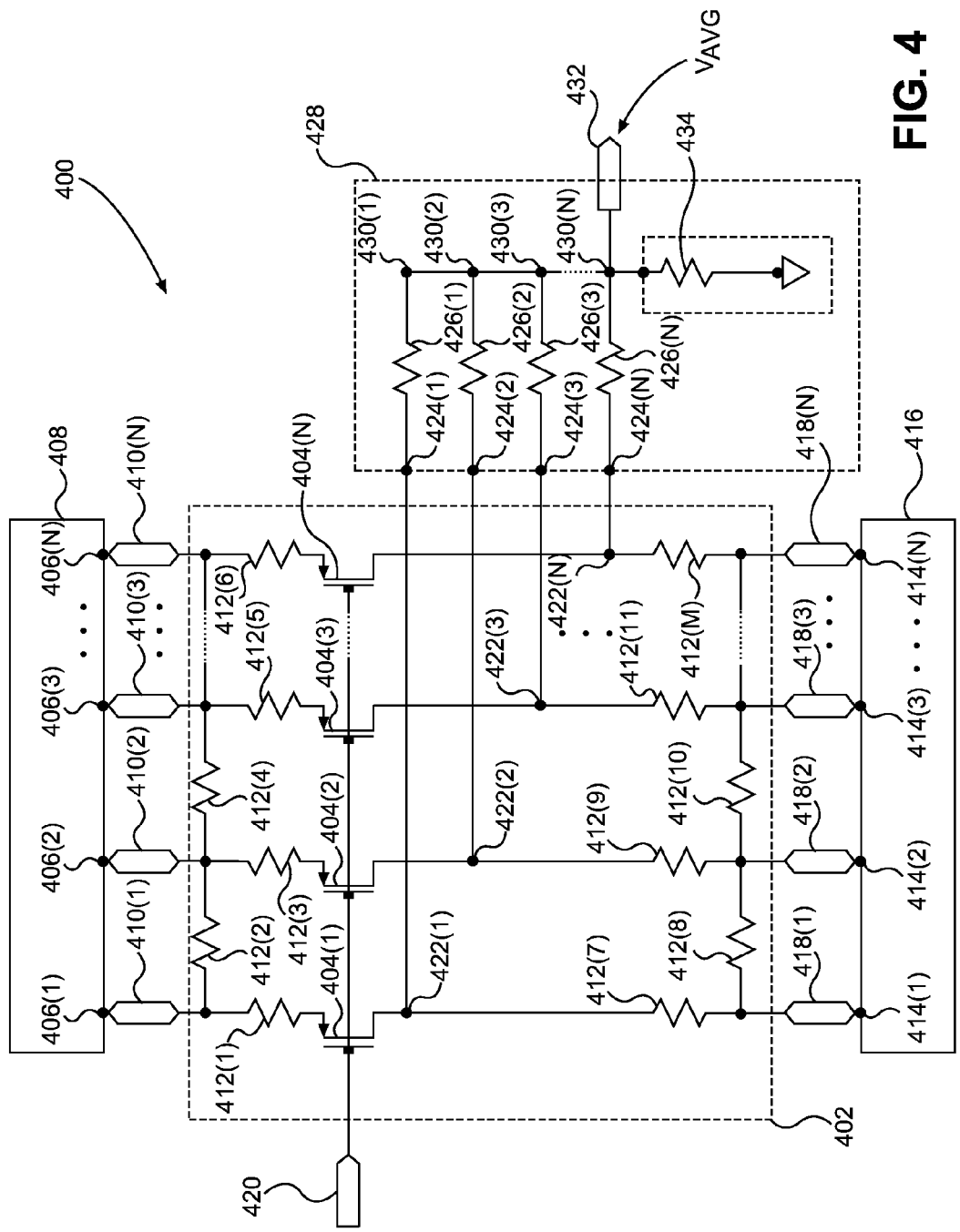
FIG. 4 is a circuit diagram of another exemplary distributed voltage network circuit similar to the distributed voltage network circuit in FIG. 1 but employing p-type metal-oxide semiconductor (PMOS) transistors in a distributed source distribution network.

While the NMOS distributed voltage network circuit 300 in FIG. 3 employs the NMOS transistors 304(1)-304(N) as distributed elements in the distributed source distribution network 302, other distributed voltage network circuits may employ alternative transistor types. In this regard, FIG. 4 illustrates a p-type metal-oxide semiconductor (PMOS) distributed voltage network circuit 400, wherein a distributed source distribution network 402 employs PMOS transistors 404(1)-404(N). Notably, while the PMOS transistors 404(1)-404(N) are in the distributed source distribution network 402 in this aspect, the PMOS transistors 404(1)-404(N) may be located in other elements in other aspects. Each PMOS transistor 404(1)-404(N) is coupled to a corresponding source node 406(1)-406(N) of a voltage distribution source component 408 via a corresponding source 410(1)-410(N). Similar to the distributed source distribution network 302 in FIG. 3, the distributed source distribution network 402 employs a plurality of resistive interconnects 412(1)-412(M) that, in conjunction with the PMOS transistor 404(1)-404(N), connect each source node 406(1)-406(N) to a corresponding voltage load node 414(1)-414(N) of a distributed load circuit 416. Particularly, a drain 418(1)-418(N) of each corresponding PMOS transistor 404(1)-404(N) couples to the corresponding voltage load node 414(1)-414(N). Further, voltage provided to a gate 420 of the PMOS distributed voltage network circuit 400 controls each PMOS transistor 404(1)-404(N). Voltage tap nodes 422(1)-422(N) are employed within the distributed source distribution network 402 to access the voltage from each corresponding drain 418(1)-418(N), and thus, each voltage load node 414(1)-414(N).

With continuing reference to FIG. 4, each voltage tap node 422(1)-422(N) is coupled to an input node 424(1)-424(N) of a corresponding resistor 426(1)-426(N) in a voltage averaging circuit 428. An output node 430(1)-430(N) of each resistor 426(1)-426(N) is coupled to a voltage output node 432 of the voltage averaging circuit 428. Thus, coupling each output node 430(1)-430(N) while each input node 424(1)-424(N) is coupled to a corresponding voltage tap node 422(1)-422(N) generates the average voltage ($V_{AVG}$) of the distributed load circuit 416 on the voltage output node 432. A scaling resistor 434 similar to the scaling resistor 334 in FIG. 3 may be employed in the PMOS distributed voltage network circuit 400 to scale the average voltage ($V_{AVG}$). Further, the equations and associated gate width/resistance relationships previously described in relation to FIG. 3 also apply when calculating the average voltage ($V_{AVG}$) in FIG. 4. In this manner, the average voltage ($V_{AVG}$) may be used to more accurately calculate the current in the distributed load circuit 416, as compared to calculating the current using a voltage at only one of the voltage load nodes 414(1)-414(N).

Figure 5:
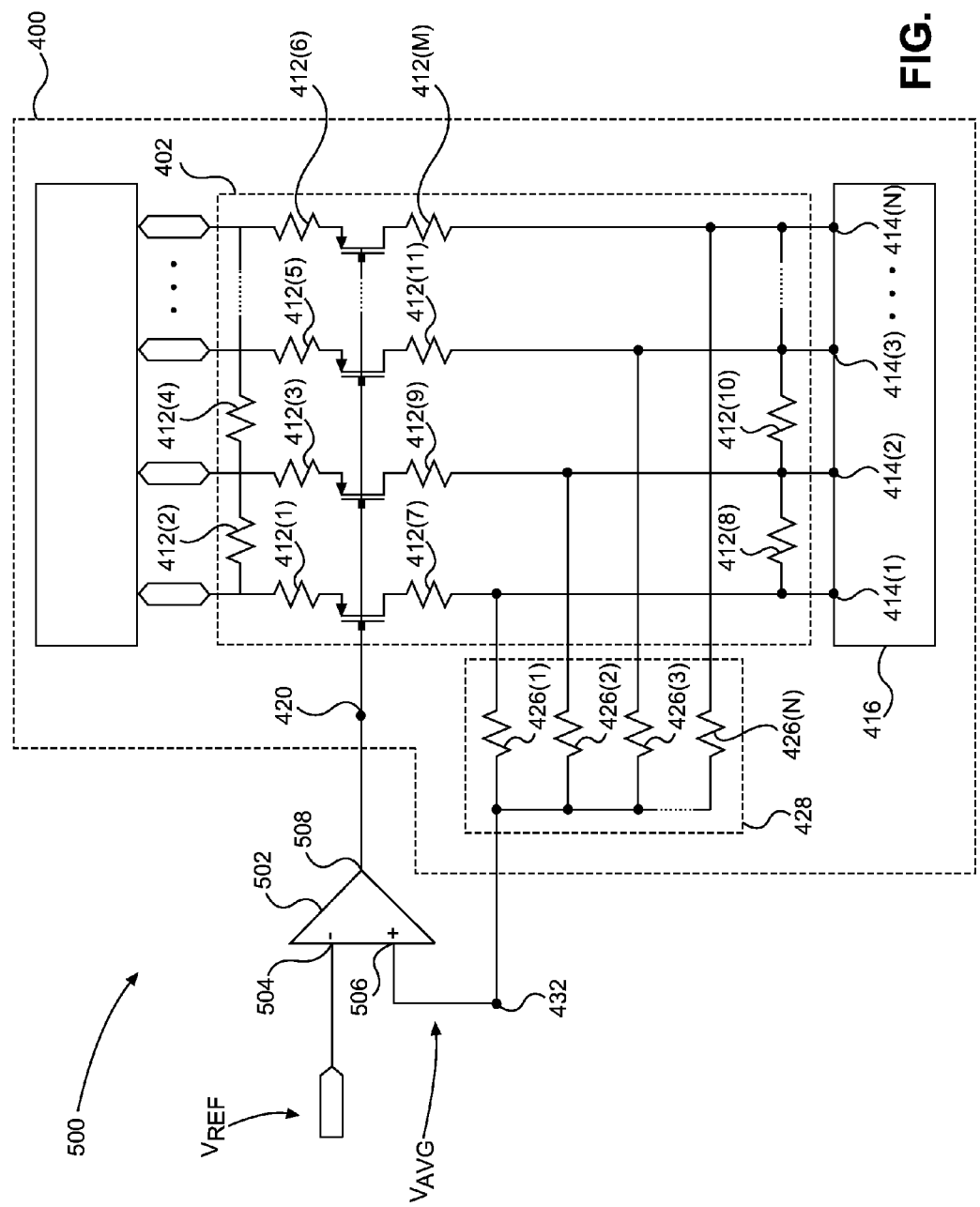
FIG. 5 is a circuit diagram of the distributed voltage network circuit employing PMOS transistors in FIG. 4, wherein an output of the voltage averaging circuit is provided to a voltage regulator configured to control an average voltage across voltage load nodes of the distributed load circuit.

In addition to using the average voltage ($V_{AVG}$) to calculate current in a distributed load circuit, the average voltage ($V_{AVG}$) may be employed to help regulate the voltage provided to a distributed load circuit, such as the distributed load circuits 104, 316, and 416 described above. In this regard, FIG. 5 illustrates a PMOS distributed voltage network circuit 500, wherein the gate 420 of the PMOS distributed voltage network circuit 400 in FIG. 4 is coupled to a voltage regulator circuit 502. In particular, a reference voltage $V_{REF}$ is provided to a first input 504 of the voltage regulator circuit 502, while the voltage output node 432 of the voltage averaging circuit 428 is coupled to a second input 506 of the voltage regulator circuit 502. An output node 508 of the voltage regulator circuit 502 is coupled to the gate 420 of the PMOS distributed voltage network circuit 400. The resistors 426(1)-426(N) sample the voltages across the distributed load circuit 416 as previously described, thus providing the average voltage ($V_{AVG}$) of the distributed load circuit 416 to the voltage regulator circuit 502. The voltage regulator circuit 502, which is an operational amplifier ("op-amp") in this aspect, forces the average voltage ($V_{AVG}$) provided to the distributed load circuit 416 to equal $V_{REF}$. In particular, by providing the average voltage ($V_{AVG}$) to the voltage regulator circuit 502, the output node 508 provides a voltage to the gate 420 so that the voltage provided to the distributed load circuit 416 is regulated to $V_{REF}$. The voltages on the voltage load nodes 414(1)-414(N) may vary depending on factors such as the resistance of the resistive interconnects 412(0)-412(M) and the physical size and layout of the distributed load circuit 416. Thus, providing the average voltage ($V_{AVG}$) to the voltage regulator circuit 502 in this manner, as opposed to providing a voltage at any one voltage load node 414(1)-414(N), helps regulate the voltage provided to the distributed load circuit 416 so as to reflect the voltage distribution of the entire distributed load circuit 416.

Figure 6:
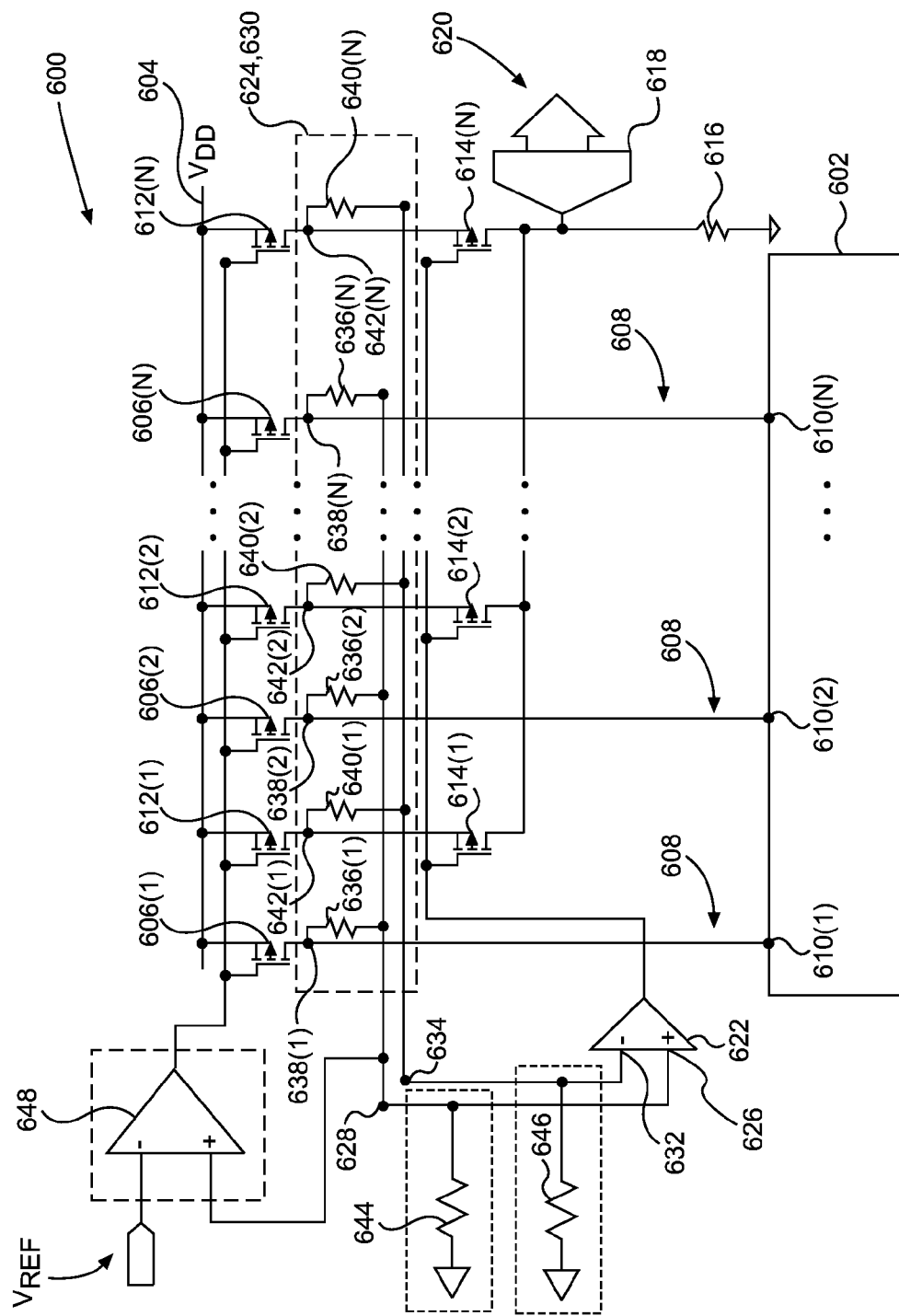
FIG. 6 is a circuit diagram of an exemplary on-die current measurement system employing voltage averaging circuits similar to the voltage averaging circuit in FIG. 1 in relation to headswitch transistors and mirror transistors, and that may employ a voltage regulator configured to regulate load voltage and current.

As previously described, the average voltage ($V_{AVG}$) may be used to more accurately calculate the current in a distributed load circuit. In this regard, FIG. 6 illustrates an on-die current measurement system 600 that yields better performance when employing voltage averaging circuits similar to the voltage averaging circuits 102, 328, and 428 in FIGS. 1, 3, and 4, respectively. The on-die current measurement system 600 is used to measure a power supply current (not shown) of a distributed load circuit 602, wherein the distributed load circuit 602 may be, as non-limiting examples, a processor core or a cache memory. To measure such a current, the on-die current measurement system 600 includes a voltage source ($V_{dd}$) 604 that provides an input voltage to a source of each headswitch transistor 606(1)-606(N). The headswitch transistors 606(1)-606(N) provide power control to the distributed load circuit 602 by allowing a voltage signal 608 to reach corresponding voltage load nodes 610(1)-610(N) on the distributed load circuit 602. The voltage source 604 also provides an input voltage to a source of each mirror transistor 612(1)-612(N). Each mirror transistor 612(1)-612(N) width is a fraction (f) of the width of the corresponding headswitch transistor 606(1)-606(N). The headswitch transistors 606(1)-606(N) and the mirror transistors 612(1)-612(N) are biased deep in the field effect transistor (FET) triode region, effectively making them function as low value resistors. Notably, although the headswitch transistors 606(1)-606(N) and the mirror transistors 612(1)-612(N) are employed as PMOS transistors in this aspect, other aspects may employ the headswitch transistors 606(1)-606(N) and the mirror transistors 612(1)-612(N) as NMOS transistors. Further, a voltage provided by each mirror transistor 612(1)-612(N) traverses a corresponding cascode transistor 614(1)-614(N) into a sense resistor 616. A voltage from the sense resistor 616 is provided to an analog-to-digital converter (ADC) 618, which converts the voltage into a digital data stream 620 that represents the power supply current of the distributed load circuit 602.

With continuing reference to FIG. 6, in order for the on-die current measurement system 600 to function properly, the headswitch transistors 606(1)-606(N) and the mirror transistors 612(1)-612(N) need to have precisely equal drain-source voltages. In this manner, an op-amp 622, together with the cascode transistors 614(1)-614(N), forces the drain-source voltage of the mirror transistors 612(1)-612(N) to equal that of the headswitch transistors 606(1)-606(N). More specifically, the op-amp 622 controls the cascode transistors 614(1)-614(N) in order to keep the current on the mirror transistors 612(1)-612(N) equal to a fraction (f) of the current on the headswitch transistors 606(1)-606(N). In doing so, the drain-source voltages of the mirror transistors 612(1)-612(N) and the headswitch transistors 606(1)-606(N) are kept equal to one another. Notably, this aspect illustrates the headswitch transistors 606(1)-606(N), the mirror transistors 612(1)-612(N), and the cascode transistors 614(1)-614(N) as PMOS transistors in FIG. 6, but other aspects may employ other types of transistors to achieve similar functionality.

With continuing reference to FIG. 6, the headswitch transistors 606(1)-606(N) are distributed so as to couple to the distributed load circuit 602 at the corresponding voltage load nodes 610(1)-610(N) via headswitch resistive interconnects (not shown) within a distributed source distribution network (not shown). Thus, a headswitch voltage averaging circuit 624 is employed to provide an average headswitch voltage ($V_{HSAVG}$) (not shown) to a first input 626 of the op-amp 622 by way of a headswitch voltage output node 628. Similarly, the mirror transistors 612(1)-612(N) each couple to the corresponding cascode transistor 614(1)-614(N) via mirror resistive interconnects (not shown) within the distributed source distribution network. Thus, a mirror voltage averaging circuit 630 is employed to provide an average mirror voltage ($V_{MRAVG}$) (not shown) to a second input 632 of the op-amp 622 by way of a mirror voltage output node 634. Both the headswitch voltage averaging circuit 624 and the mirror voltage averaging circuit 630 include similar elements to the voltage averaging circuits 102, 328, and 428 in FIGS. 1, 3, and 4, respectively. In particular, resistors 636(1)-636(N) in the headswitch voltage averaging circuit 624 couple to a corresponding headswitch voltage tap node 638(1)-638(N) within the distributed source distribution network, and are configured to provide the average headswitch voltage ($V_{HSAVG}$) to the first input 626 of the op-amp 622. Resistors 640(1)-640(N) in the mirror voltage averaging circuit 630 couple to corresponding mirror voltage tap nodes 642(1)-642(N) within the distributed source distribution network, and are configured to provide the average mirror voltage ($V_{MRAVG}$) to the second input 632 of the op-amp 622. By providing the average headswitch voltage ($V_{HSAVG}$) and the average mirror voltage ($V_{MRAVG}$) to the op-amp 622 in this manner, the sense resistor 616 receives a voltage from which to more accurately calculate the current in the distributed load circuit 602, as compared to calculating the current using a voltage from one of the voltage load nodes 610(1)-610(N).

With continuing reference to FIG. 6, the headswitch voltage averaging circuit 624 and the mirror voltage averaging circuit 630 may each employ an additional resistor to scale the average headswitch voltage ($V_{HSAVG}$) and the average mirror voltage ($V_{MRAVG}$), respectively, if desired. More specifically, the headswitch voltage averaging circuit 624 may employ a scaling resistor 644, similar to the scaling resistor 334 in FIG. 3. In this manner, the scaling resistor 644 may be used to scale the headswitch average voltage ($V_{HSAVG}$) by a scaling factor corresponding to the resistance of the scaling resistor 644 as compared to the headswitch average voltage ($V_{HSAVG}$) generated when the scaling resistor 644 is not employed. The mirror voltage averaging circuit 630 may employ a scaling resistor 646 in a similar manner as the headswitch voltage averaging circuit 624 to scale the average mirror voltage ($V_{MRAVG}$).

In addition to measuring the current of the distributed load circuit 602, the on-die current measurement system 600 may also be configured to regulate the load voltage and current provided to the distributed load circuit 602. In this regard, a voltage regulator circuit 648 that is configured to regulate the voltage, and thus the current, provided across the distributed load circuit 602 may be employed in the on-die current measurement system 600. The voltage regulator circuit 648 is configured to operate similar to the voltage regulator circuit 502 in FIG. 5. In this manner, by receiving the reference voltage $V_{REF}$ and the average headswitch voltage ($V_{HSAVG}$), the voltage regulator circuit 648 provides a voltage to the distributed load circuit 602 that is approximately equal to the reference voltage $V_{REF}$. Regulating the load voltage provided to the distributed load circuit 602 in this manner may help to ensure that the load voltage of the distributed load circuit 602 is maintained approximately at a desired level.

Figure 7A:
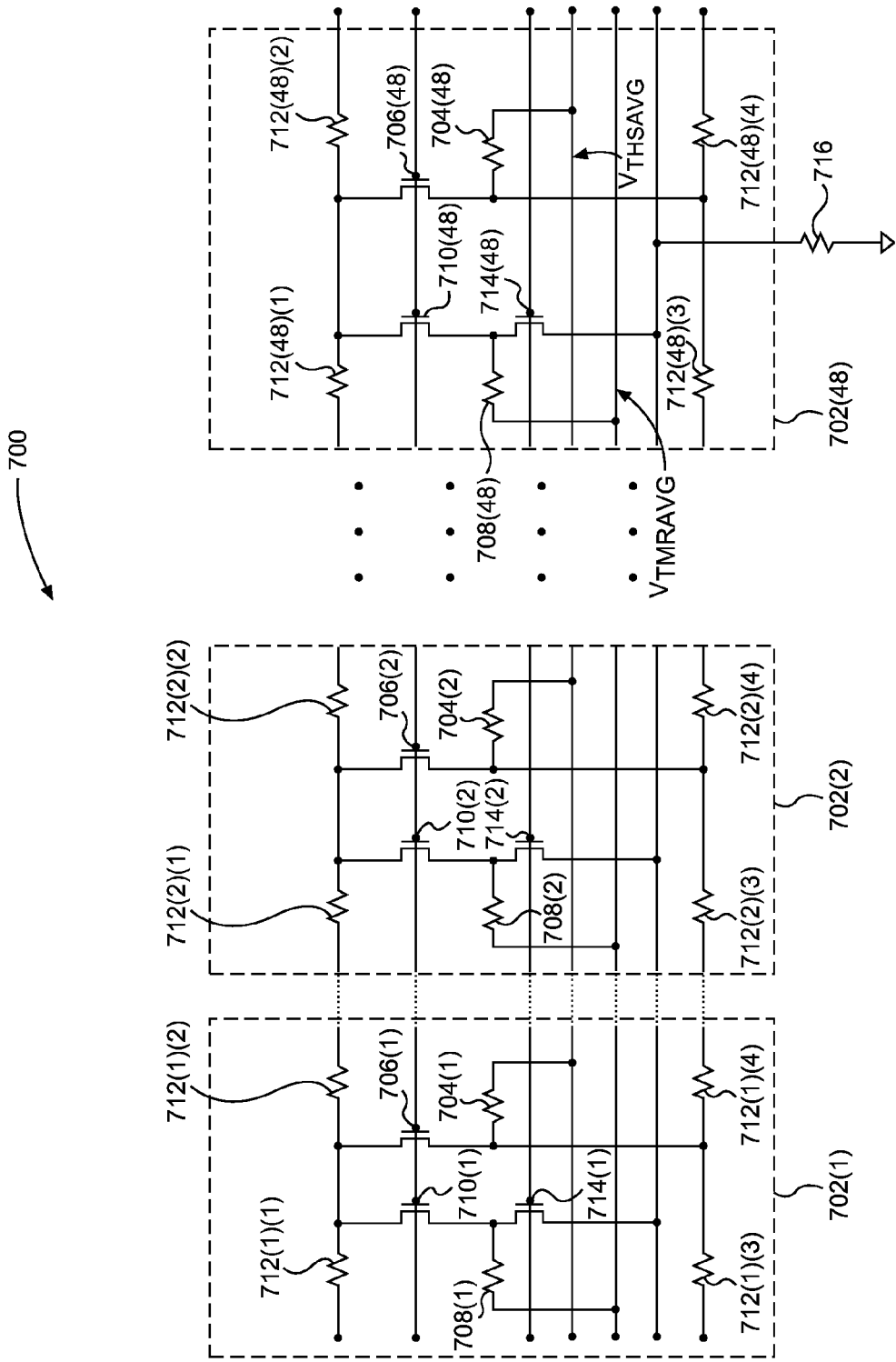
FIG. 7A is a diagram of an exemplary test circuit that employs a plurality of headswitch tiles that include the voltage averaging circuit similar to the voltage averaging circuit in FIG. 1.

To illustrate the more accurate voltage and current measurements that may be realized by employing the voltage averaging circuits 102, 328, and 428 in FIGS. 1, 3, and 4, respectively, and the headswitch voltage averaging circuit 624 and mirror voltage averaging circuit 630 in FIG. 6, test circuits may be used to generate sample data. In this regard, FIG. 7A illustrates a first test circuit 700 that employs headswitch tiles 702(1)-702(48). A resistor 704(1)-704(48) is coupled to a corresponding headswitch transistor 706(1)-706(48) to generate an average test headswitch voltage ($V_{THSAVG}$) in a similar manner to the headswitch voltage averaging circuit 624 in FIG. 6. Further, a resistor 708(1)-708(48) is coupled to a corresponding mirror transistor 710(1)-710(48) to generate an average test mirror voltage ($V_{TMRAVG}$) in a similar manner to the mirror voltage averaging circuit 630 in FIG. 6. A plurality of parasitic resistors 712(1)(1)-712(48)(4) are included in the first test circuit 700 to simulate interconnection resistance. A cascode transistor 714(1)-714(48) corresponding to each mirror transistor 710(1)-710(48) is also included in each headswitch tile 702(1)-702(48). In this manner, currents from the cascode transistors 714(1)-714(48) are summed up and provided to a sense resistor 716.

Figure 7B:
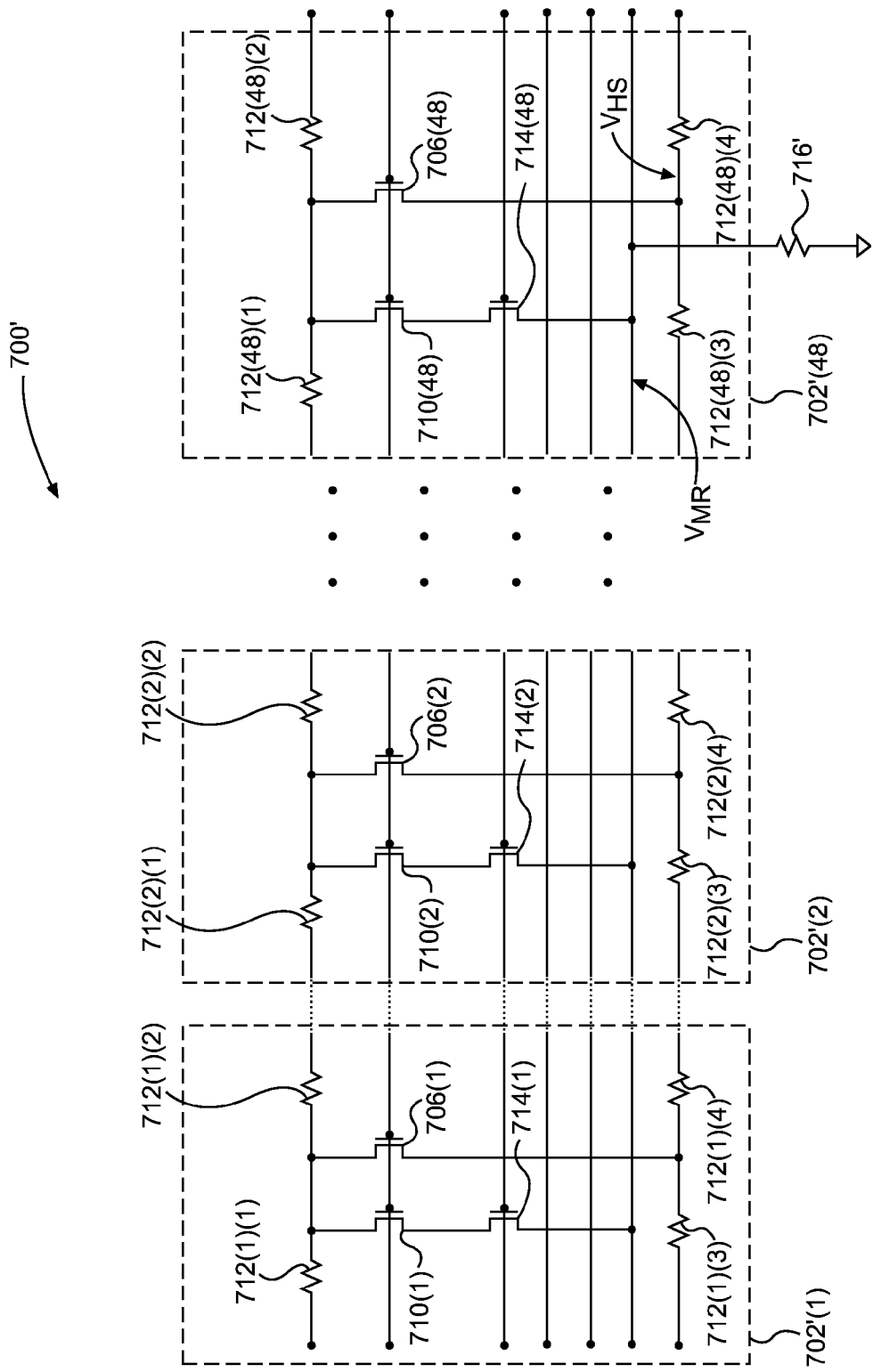
FIG. 7B is a diagram of an exemplary test circuit that employs a plurality of headswitch tiles, wherein a voltage is measured at a single headswitch tile rather than measuring an average voltage of the entire test circuit.

Additionally, FIG. 7B illustrates a second test circuit 700' that employs headswitch tiles 702'(1)-702'(48). Each headswitch tile 702'(1)-702'(48) includes a corresponding headswitch transistor 706(1)-706(48) and a corresponding mirror transistor 710(1)-710(48) similar to the first test circuit 700 in FIG. 7A. The plurality of parasitic resistors 712(1)(1)-712(48)(4), as well as the cascode transistors 714(1)-714(48), are also included in the second test circuit 700'. However, the headswitch tiles 702'(1)-702'(48) do not include resistors 704(1)-704(48) and 708(1)-708(48) coupled to corresponding headswitch transistors 706(1)-706(48) and mirror transistors 710(1)-710(48), respectively, as in the first test circuit 700 in FIG. 7A. In this manner, the second test circuit 700' does not generate an average test headswitch voltage ($V_{THSAVG}$) and an average test mirror voltage ($V_{TMRAVG}$). Rather, a headswitch voltage ($V_{HS}$) and a mirror voltage ($V_{MR}$) is measured at the headswitch tile 702' (48). Currents from the cascode transistors 714(1)-714(48) are summed up and provided to a sense resistor 716'.

Figure 8A:
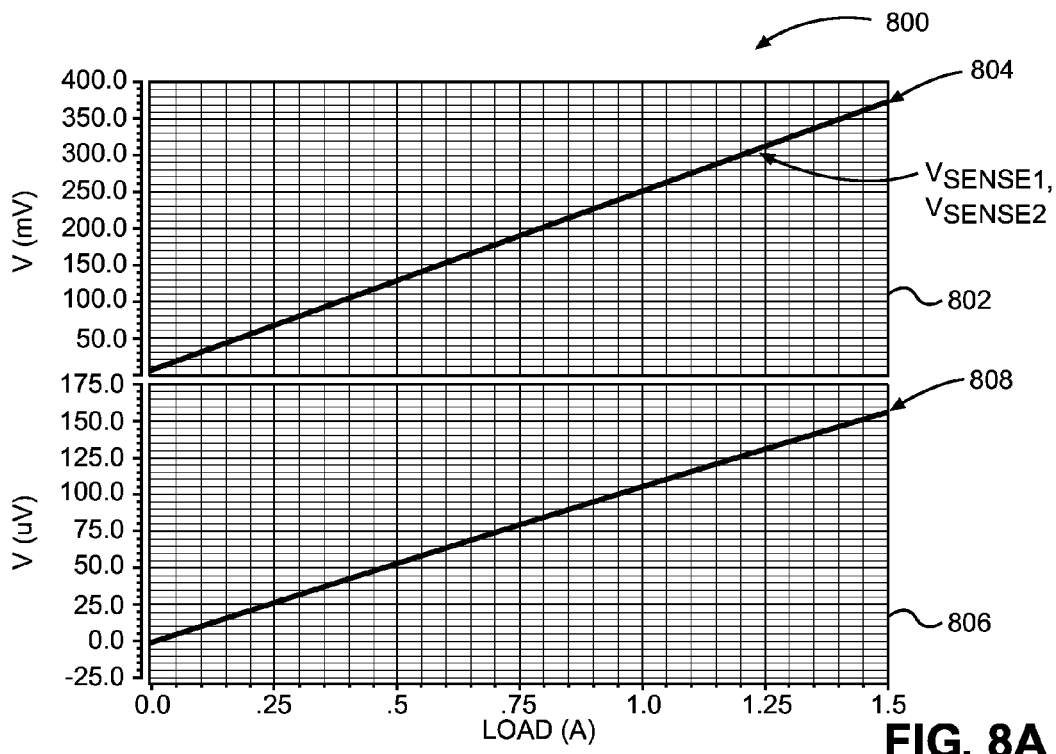
FIG. 8A is a graph illustrating an exemplary set of signals corresponding to average voltage measured across the test circuits in FIGS. 7A and 7B with ideal non-resistive metal interconnects.

In this regard, FIG. 8A illustrates an exemplary set of signals 800 corresponding to average current measured across the first and second test circuits 700, 700' in FIGS. 7A and 7B with ideal non-resistive metal interconnects. Particularly, each parasitic resistor 712(1)(1)-712(48)(4) has a resistance equal to zero Ohms (0Ω) so as to remove any effect the parasitic resistors 712(1)(1)-712(48)(4) may have on the distributed voltage. Further, each sense resistor 716, 716' has a resistance equal to 300 Ohms (Ω). A voltage ($V_{SENSE1}$) across the sense resistor 716, and a voltage ($V_{SENSE2}$) across the sense resistor 716', are both illustrated in a first graph 802. Notably, the voltage ($V_{SENSE1}$) and the voltage $V_{SENSE2}$ are approximately equal at multiple current values. For example, at a maximum current of 1.5 A, as indicated by arrow 804, both ($V_{SENSE1}$) and ($V_{SENSE2}$) are approximately equal to 374 mV. This is evidenced in a second graph 806 that illustrates the difference in the values between ($V_{SENSE1}$) and ($V_{SENSE2}$). More specifically, the maximum difference existing between ($V_{SENSE1}$) and ($V_{SENSE2}$) occurs at 1.5 A, wherein the difference is approximately only 160 μV (micro-Volts), as indicated by arrow 808. Thus, with the effects of parasitic resistors 712(1)(1)-712(48)(4) effectively removed, the first test circuit 700 and the second test circuit 700' generate close to an effectively ideal voltage across the respective sense resistors 716, 716' of approximately 374 mV.

Figure 8B:
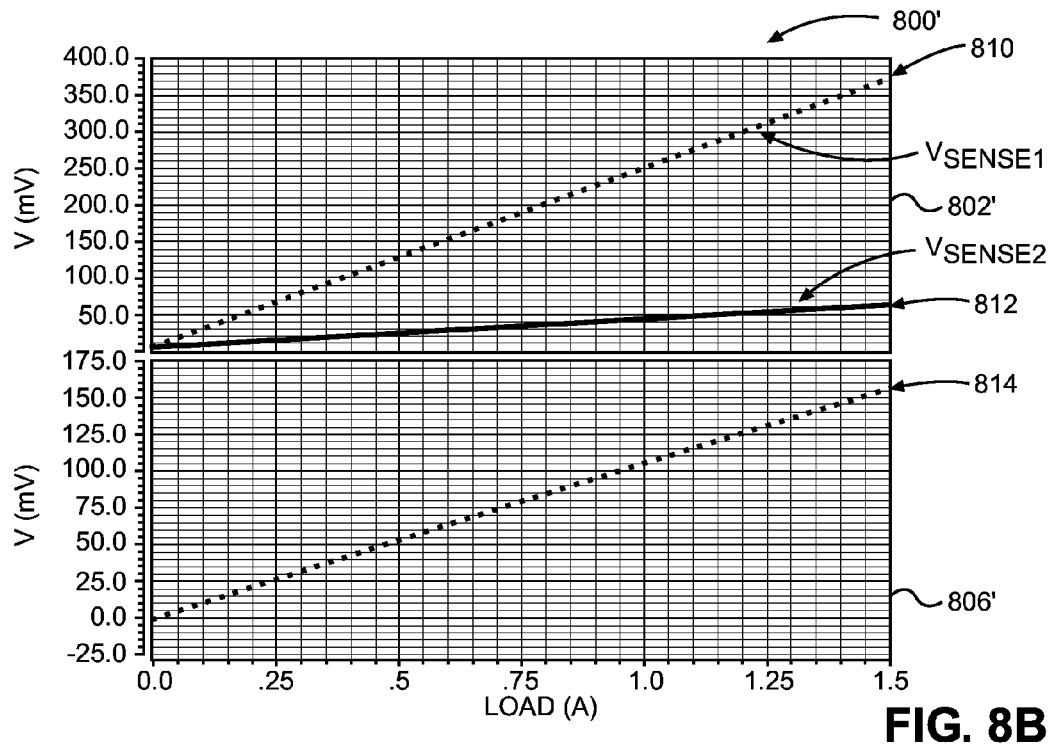
FIG. 8B is a graph illustrating an exemplary set of signals corresponding to average voltage measured across the test circuits in FIGS. 7A and 7B with non-ideal resistive metal interconnects.

In this regard, FIG. 8B illustrates an exemplary set of signals 800' corresponding to average current measured across first and second test circuits 700, 700' in FIGS. 7A and 7B with non-ideal resistive metal interconnects. Particularly, each parasitic resistor 712(1)(1)-712(48)(4) has a non-zero Ohm resistance in this aspect. The voltage ($V_{SENSE1}$) and the voltage ($V_{SENSE2}$) are both illustrated in a first graph 802'. Notably, the values of ($V_{SENSE1}$) and ($V_{SENSE2}$) are not equal at varying levels of current, as in FIG. 8A. For example, at a current of 1.5 A, ($V_{SENSE1}$) has a value approximately equal to 374 mV, as indicated by arrow 810, which is the same value of ($V_{SENSE1}$) in the ideal case described in FIG. 8A. However, at a current of 1.5 A, ($V_{SENSE2}$) has a value approximately equal to 63 mV, as indicated by arrow 812. This difference in values is further illustrated in a second graph 806', which shows that the maximum difference existing between ($V_{SENSE1}$) and ($V_{SENSE2}$) again occurs at 1.5 A, wherein the difference is approximately 311 mV, as indicated by arrow 814. Using nominal scaling factors, a value of 63 mV for ($V_{SENSE2}$) represents a "measured" current of 252 mA, as compared to the actual current of 1.5 A.

In this regard, comparing the ideal case illustrated in FIG. 8A to the more realistic case illustrated in FIG. 8B demonstrates that employing voltage averaging in the first test circuit 700 essentially eliminates variation in measured voltage and current based on varying current distribution profiles across a load circuit. More specifically, under the realistic conditions in FIG. 8B, the second test circuit 700' provides a voltage and current that is far below those generated under the ideal conditions in FIG. 8A. However, under the realistic conditions in FIG. 8B, the first test circuit 700 generates a voltage and current that are approximately equal to those generated under the ideal conditions in FIG. 8A. In other words, the first test circuit 700 measures the average voltage, while the second test circuit 700' measures a voltage at a single voltage load node. Thus, the first test circuit 700 provides a consistent average voltage measurement, while the second test circuit 700' provides varying voltages depending on from which voltage load node the voltage is measured. Therefore, employing voltage averaging as disclosed herein may be used to more accurately calculate the current in a distributed load circuit, as compared to calculating the current using a voltage present in a single voltage load node.

Figure 9:
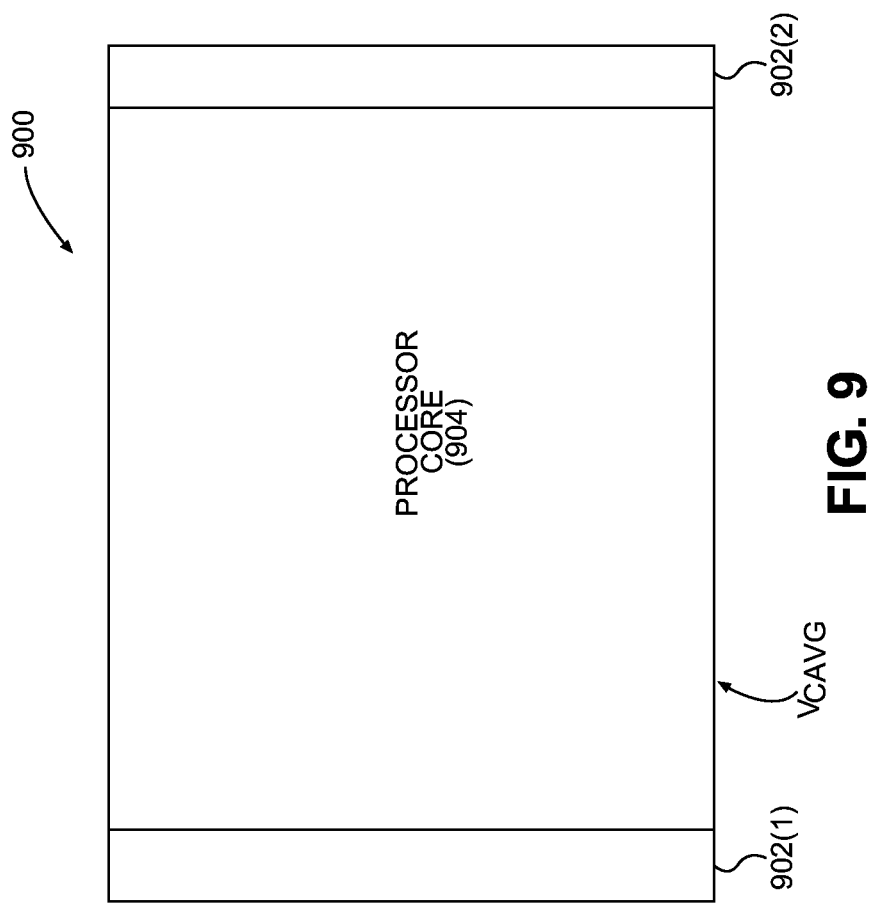
FIG. 9 is a block diagram of an exemplary plurality of headswitch tiles coupled to a processor core so as to measure average load current of the processor core by employing the voltage averaging circuit in FIG. 1.

In this regard, FIG. 9 illustrates a system 900 wherein headswitch circuits 902(1), 902(2) are distributed around a processor core 904 so as to measure average load voltage of the processor core 904. Each headswitch circuit 902(1), 902(2) includes a plurality of headswitch tiles similar to the headswitch tiles 702 in FIG. 7A. The processor core 904 includes a plurality of digital circuits, each of which may be active at varying times. Because the various digital circuits within the processor core 904 may be active at different times, the voltage and current distribution throughout the processor core 904 and headswitch circuits 902(1), 902(2) may vary dramatically over time. The voltage averaging mechanism included in the headswitch circuits 902(1), 902(2), as described in previous figures, and particularly in FIG. 7A, measures the average core voltage ($V_{CAVG}$) distributed in the processor core 904. Therefore, the average core voltage ($V_{CAVG}$) may be used to more accurately calculate the current distributed in the processor core 904, as compared to calculating the current using a voltage at only one location at a single point in time.

The distributed voltage network circuits employing voltage averaging according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
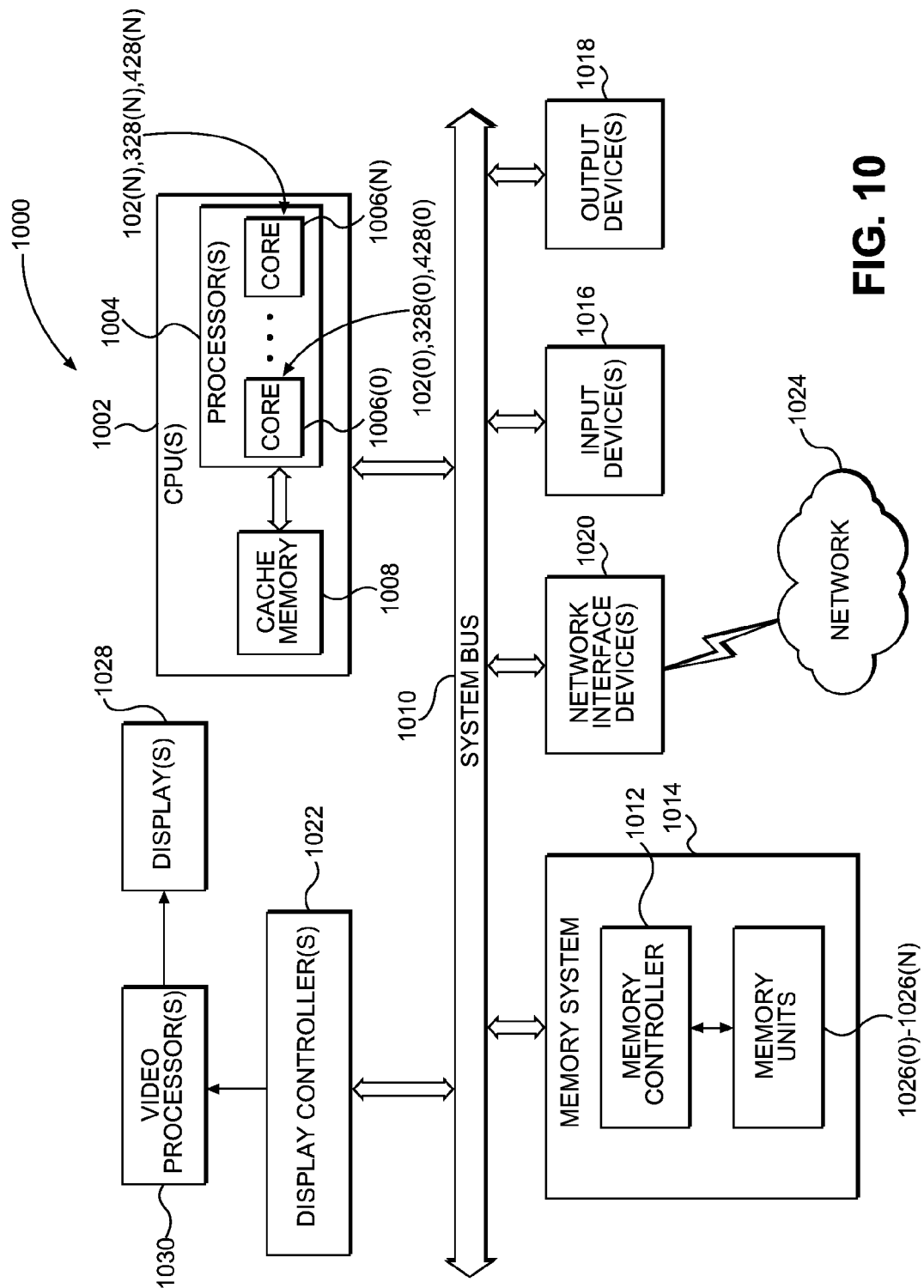
FIG. 10 is a block diagram of an exemplary processor-based system that may include the distributed voltage network circuit employing the voltage averaging circuits in FIGS. 1, 3, and 4.

In this regard, FIG. 10 illustrates an example of a processor-based system 1000 that can employ the voltage averaging circuits 102, 328, and 428 illustrated in FIGS. 1, 3, and 4, respectively. In this example, the processor-based system 1000 includes one or more central processing units (CPUs) 1002, each including one or more processors 1004. Each of the one or more processors 1004 may employ a plurality of cores 1006(0)-1006(N), wherein the average load voltage and load current of each core 1006(0)-1006(N) may be calculated using a corresponding voltage averaging circuit, such as the voltage averaging circuits 102(0)-102(N), 328(0)-328(N), or 428(0)-428(N). The CPU(s) 1002 may be a master device. The CPU(s) 1002 may have cache memory 1008 coupled to the processor(s) 1004 for rapid access to temporarily stored data. The CPU(s) 1002 is coupled to a system bus 1010 and can intercouple master and slave devices included in the processor-based system 1000. As is well known, the CPU(s) 1002 communicates with these other devices by exchanging address, control, and data information over the system bus 1010. For example, the CPU(s) 1002 can communicate bus transaction requests to a memory controller 1012 as an example of a slave device. Although not illustrated in FIG. 10, multiple system buses 1010 could be provided, wherein each system bus 1010 constitutes a different fabric.

Other master and slave devices can be connected to the system bus 1010. As illustrated in FIG. 10, these devices can include a memory system 1014, one or more input devices 1016, one or more output devices 1018, one or more network interface devices 1020, and one or more display controllers 1022, as examples. The input device(s) 1016 can include any type of input device, including but not limited to input keys, switches, voice processors, etc. The output device(s) 1018 can include any type of output device, including but not limited to audio, video, other visual indicators, etc. The network interface device(s) 1020 can be any devices configured to allow exchange of data to and from a network 1024. The network 1024 can be any type of network, including but not limited to a wired or wireless network, a private or public network, a local area network (LAN), a wide local area network (WLAN), and the Internet. The network interface device(s) 1020 can be configured to support any type of communications protocol desired. The memory system 1014 can include one or more memory units 1026(0)-1026(N).

The CPU(s) 1002 may also be configured to access the display controller(s) 1022 over the system bus 1010 to control information sent to one or more displays 1028. The display controller(s) 1022 sends information to the display(s) 1028 to be displayed via one or more video processors 1030, which process the information to be displayed into a format suitable for the display(s) 1028. The display(s) 1028 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A distributed voltage network circuit, comprising:
   a voltage distribution source component comprising a plurality of source nodes;
   a distributed load circuit comprising a plurality of voltage load nodes;
   a distributed source distribution network, comprising:
      a plurality of resistive interconnects interconnecting each source node among the plurality of source nodes to a corresponding voltage load node among the plurality of voltage load nodes; and
      a plurality of voltage tap nodes, wherein each voltage tap node corresponds to a voltage load node among the plurality of voltage load nodes; and
   a voltage averaging circuit, comprising:
      a plurality of resistive elements, each resistive element among the plurality of resistive elements comprising:
         an input node coupled to a corresponding voltage tap node among the plurality of voltage tap nodes; and
         an output node; and
      a voltage output node coupled to the output node of each resistive element among the plurality of resistive elements, the voltage output node configured to provide an average voltage of the distributed load circuit.

2. The distributed voltage network circuit of claim 1, wherein each resistive element among the plurality of resistive elements comprises a resistor.

3. The distributed voltage network circuit of claim 1, wherein the voltage averaging circuit further comprises:
a scaling resistor coupled between a ground source and the output node of each resistive element among the plurality of resistive elements,
the scaling resistor configured to scale the average voltage on the voltage output node.

4. The distributed voltage network circuit of claim 1, further comprising a plurality of transistors, each transistor among the plurality of transistors corresponding to a source node among the plurality of source nodes and a voltage load node among the plurality of voltage load nodes.

5. The distributed voltage network circuit of claim 4, wherein each transistor among the plurality of transistors has an approximately equal gate width.

6. The distributed voltage network circuit of claim 5, wherein each resistive element among the plurality of resistive elements in the voltage averaging circuit has an approximately equal resistance.

7. The distributed voltage network circuit of claim 4, wherein at least two transistors among the plurality of transistors have different gate widths.

8. The distributed voltage network circuit of claim 7, wherein each resistive element among the plurality of resistive elements in the voltage averaging circuit has a resistance based on a gate width of the transistor corresponding to the voltage load node of the corresponding voltage tap node.

9. The distributed voltage network circuit of claim 4, wherein each transistor among the plurality of transistors comprises an n-type metal-oxide semiconductor (NMOS) transistor.

10. The distributed voltage network circuit of claim 4, wherein each transistor among the plurality of transistors comprises a p-type metal-oxide semiconductor (PMOS) transistor.

11. The distributed voltage network circuit of claim 1, further comprising a voltage regulator circuit configured to regulate a voltage provided to the distributed load circuit, the voltage regulator circuit comprising:
a first input coupled to a reference voltage source;
a second input coupled to the voltage output node of the voltage averaging circuit; and
an output coupled to the distributed source distribution network.

12. The distributed voltage network circuit of claim 1 integrated into an integrated circuit (IC).

13. The distributed voltage network circuit of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

14. A distributed voltage network circuit, comprising:
a means for distributing a source voltage to a plurality of voltage load nodes of a distributed load circuit via a distributed source distribution network, wherein the distributed source distribution network comprises a plurality of resistive interconnects interconnecting each source node of a plurality of source nodes to a corresponding voltage load node among the plurality of voltage load nodes;
a means for receiving the source voltage at the plurality of voltage load nodes;
a means for determining a voltage present at each voltage load node among the plurality of voltage load nodes via a corresponding voltage tap node of a plurality of voltage tap nodes;
a means for providing the voltage present at each voltage tap node among the plurality of voltage tap nodes to a corresponding resistive element of a plurality of resistive elements; and
a means for providing an output voltage of each resistive element among the plurality of resistive elements to a voltage output node configured to provide an average voltage of the distributed load circuit.

15. A method of calculating an average voltage of a distributed load circuit, comprising:
distributing a source voltage to a plurality of voltage load nodes of the distributed load circuit via a distributed source distribution network, wherein the distributed source distribution network comprises a plurality of resistive interconnects interconnecting each source node of a plurality of source nodes to a corresponding voltage load node among the plurality of voltage load nodes;
receiving the source voltage at the plurality of voltage load nodes;
determining a voltage present at each voltage load node among the plurality of voltage load nodes via a corresponding voltage tap node of a plurality of voltage tap nodes;
providing the voltage present at each voltage tap node among the plurality of voltage tap nodes to a corresponding resistive element among a plurality of resistive elements; and
providing an output voltage of each resistive element among the plurality of resistive elements to a voltage output node configured to provide the average voltage of the distributed load circuit.

16. The method of claim 15, further comprising scaling the average voltage on the voltage output node.

17. The method of claim 15, further comprising regulating the source voltage received at each voltage load node among the plurality of voltage load nodes.

18. An on-die current measurement system, comprising:
a voltage source;
a distributed load circuit comprising a plurality of voltage load nodes;
a plurality of cascode transistors;
a plurality of headswitch transistors, wherein each headswitch transistor among the plurality of headswitch transistors is coupled to the voltage source;
a plurality of mirror transistors, wherein each mirror transistor among the plurality of mirror transistors is coupled to the voltage source;
a distributed source distribution network, comprising:
a plurality of headswitch resistive interconnects interconnecting each headswitch transistor among the plurality of headswitch transistors to a corresponding voltage load node among the plurality of voltage load nodes;
a plurality of mirror resistive interconnects interconnecting each mirror transistor among the plurality of mirror transistors to a source of a corresponding cascode transistor among the plurality of cascode transistors;

a plurality of headswitch voltage tap nodes, wherein each headswitch voltage tap node corresponds to a voltage load node among the plurality of voltage load nodes; and
a plurality of mirror voltage tap nodes, wherein each mirror voltage tap node corresponds to a cascode transistor among the plurality of cascode transistors;
a headswitch voltage averaging circuit, comprising:
   a plurality of resistors, each resistor among the plurality of resistors comprising:
      an input node coupled to a corresponding headswitch voltage tap node among the plurality of headswitch voltage tap nodes; and
      an output node; and
   a headswitch voltage output node coupled to the output node of each resistor, the headswitch voltage output node configured to provide an average headswitch voltage present in the distributed load circuit;
a mirror voltage averaging circuit, comprising:
   a plurality of resistors, each resistor among the plurality of resistors comprising:
      an input node coupled to a corresponding mirror transistor among the plurality of mirror transistors; and
      an output node; and
   a mirror voltage output node coupled to the output node of each resistor, the mirror voltage output node configured to provide an average mirror voltage present in the plurality of cascode transistors;
a drain of each cascode transistor among the plurality of cascode transistors coupled to a sense resistor;
the sense resistor configured to provide a voltage to an analog-to-digital converter (ADC);
the ADC configured to convert the voltage from the sense resistor into a digital signal representative of a power supply current of the distributed load circuit; and
an operational amplifier, comprising:
   a first input coupled to the headswitch voltage output node;
   a second input coupled to the mirror voltage output node; and
   an output node coupled to a gate corresponding to the plurality of cascode transistors.

19. The on-die current measurement system of claim 18, wherein the headswitch voltage averaging circuit further comprises:
   a scaling resistor coupled between a ground source and the output node of each resistor among the plurality of resistors in the headswitch voltage averaging circuit,
   the scaling resistor configured to scale the average headswitch voltage on the headswitch voltage output node.

20. The on-die current measurement system of claim 18, wherein the mirror voltage averaging circuit further comprises:
   a scaling resistor coupled between a ground source and the output node of each resistor among the plurality of resistors in the mirror voltage averaging circuit,
   the scaling resistor configured to scale the average mirror voltage on the mirror voltage output node.

21. The on-die current measurement system of claim 18, further comprising a voltage regulator circuit configured to regulate a voltage provided to the distributed load circuit, the voltage regulator circuit comprising:
   a first input coupled to a reference voltage source;
   a second input coupled to the headswitch voltage output node of the headswitch voltage averaging circuit; and
   an output coupled to a gate of each headswitch transistor among the plurality of headswitch transistors and a gate of each mirror transistor among the plurality of mirror transistors.

22. The on-die current measurement system of claim 18, wherein:
   each headswitch transistor among the plurality of headswitch transistors comprises a p-type metal-oxide semiconductor (PMOS) transistor; and
   each mirror transistor among the plurality of mirror transistors comprises a PMOS transistor.

23. The on-die current measurement system of claim 22, wherein each cascode transistor among the plurality of cascode transistors comprises a PMOS transistor.

24. The on-die current measurement system of claim 18, wherein the distributed load circuit comprises a processor core.

25. The on-die current measurement system of claim 18, wherein the distributed load circuit comprises a cache memory.

* * * * *